United States Patent
Sugisawa

(10) Patent No.: US 10,411,699 B2
(45) Date of Patent: Sep. 10, 2019

(54) POWER SUPPLY CONTROL DEVICE

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Yuuki Sugisawa, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/086,935

(22) PCT Filed: Mar. 21, 2017

(86) PCT No.: PCT/JP2017/011192
§ 371 (c)(1),
(2) Date: Sep. 20, 2018

(87) PCT Pub. No.: WO2017/175578
PCT Pub. Date: Oct. 12, 2017

(65) Prior Publication Data
US 2019/0103867 A1    Apr. 4, 2019

(30) Foreign Application Priority Data
Apr. 5, 2016  (JP) .................................. 2016-075884

(51) Int. Cl.
*H03K 17/687* (2006.01)
*H03K 17/30* (2006.01)
(Continued)

(52) U.S. Cl.
CPC ............ *H03K 17/6872* (2013.01); *H02J 7/00* (2013.01); *H02J 7/0063* (2013.01);
(Continued)

(58) Field of Classification Search
CPC .......... H02J 7/00; H02J 7/0063; H02J 7/0065; H02J 7/0067; H03K 17/00; H03K 17/30;
(Continued)

(56) References Cited

U.S. PATENT DOCUMENTS 6,304,422 B1   10/2001 Sander et al.
6,639,444 B2 * 10/2003 Ikeda ............... H03K 17/08142
                                                     327/325
2006/0126253 A1 *  6/2006 Urakabe ................. H02M 1/38
                                                     361/118

FOREIGN PATENT DOCUMENTS

JP      H11-308780 A    11/1999
JP      2001-224135 A    8/2001
(Continued)

OTHER PUBLICATIONS

Jun. 13, 2017 International Search Report issued in International Patent Application PCT/JP2017/011192.

*Primary Examiner* — Lincoln D Donovan
*Assistant Examiner* — Diana J. Cheng
(74) *Attorney, Agent, or Firm* — Oliff PLC

(57) ABSTRACT

A power supply control device that includes a controller configured to switch on and off a first semiconductor switch and a plurality of second semiconductor switches whose current input terminals are connected to a current output terminal of the first semiconductor switch, the controller being configured to control supply of power via the plurality of second semiconductor switches by switching; a first parasitic diode connected between a current input terminal and the current output terminal of the first semiconductor switch; and a plurality of second parasitic diodes that are (Continued)

respectively connected between the current input terminals and current output terminals of the plurality of second semiconductor switches.

4 Claims, 5 Drawing Sheets

(51) Int. Cl.
    *H03K 17/693*     (2006.01)
    *H02J 7/00*     (2006.01)

(52) U.S. Cl.
    CPC ......... *H03K 17/302* (2013.01); *H03K 17/687* (2013.01); *H03K 17/693* (2013.01)

(58) Field of Classification Search
    CPC ...... H03K 17/302; H03K 17/51; H03K 17/56; H03K 17/687; H03K 17/6871; H03K 17/6872
    See application file for complete search history.

(56) References Cited

FOREIGN PATENT DOCUMENTS

| | | |
|---|---|---|
| JP | 2002-528938 A | 9/2002 |
| JP | 2014-072596 A | 4/2014 |
| JP | 5772776 B2 | 9/2015 |

\* cited by examiner

POWER SUPPLY CONTROL DEVICE

This application is the U.S. National Phase of PCT/JP2017/011192 filed Mar. 31, 2017, which claims priority to JP 2016-075884 filed Apr. 5, 2016, the entire disclosure of which is incorporated herein by reference.

BACKGROUND

The present disclosure relates to a power supply control device configured to control the supply of power via a plurality of switches.

Power supply control devices configured to control the supply of power from a battery to a load are installed in vehicles (e.g., see Japanese Patent 5772776). The power supply control device disclosed in Japanese Patent 5772776 includes two N-channel FETs (Field Effect Transistors), and the drain of one of the FETs is connected to the drain of the other PET. The source of one of the FETs is connected to a positive electrode of the battery and a source of the other FET is connected to one end of the load. A negative electrode of the battery is connected to the other end of the load.

Parasitic diodes are connected between the drains and sources of the two FETs. In the two FETs, the cathode of the parasitic diode is connected to the drain, and the anode of the parasitic diode is connected to the source. Therefore, in the power supply control device disclosed in Japanese Patent 5772776, the cathode of the parasitic diode of one of the FETs is connected to the cathode of the parasitic diode of the other FET.

If the two FETs are switched on together, a current flows between the drains and the sources of the two FETs, and power is supplied to the load from the battery. If the two FETs are switched off together, no current flows between the drains and the sources of the two FETs. Furthermore, because the cathodes of the two parasitic diodes of the two FETs are connected to each other, if the two FETs are off together, no current flows via the two parasitic diodes.

Also, even if the positive electrode of the battery is connected to the other end of the load and the negative electrode of the battery is connected to the source of one of the FETs in a state in which the two FETs are off together, no current flows via the two parasitic diodes, and thus no power is supplied to the load.

SUMMARY

As disclosed in Japanese Patent 5772776, a power supply control device to which two FETs are connected between the battery and each load is conceivable as a power supply control device configured to control the supply of power from a battery to a plurality of loads. However; the number of FETs included in this power supply control device is twice the number of loads, which is a large number. Thus, this power supply control device in which two FETs are connected between the battery and each load is problematic in that its size is large and the manufacturing cost increases.

An exemplary aspect of the disclosure provides a power supply control device configured to control the supply of power using a small number of semiconductor switches as appropriate.

A power supply control device according to the present disclosure includes a controller configured to switch on and off a first semiconductor switch and a plurality of second semiconductor switches whose current input terminals are connected to a current output terminal of the first semiconductor switch, the controller being configured to control supply of power via the plurality of second semiconductor switches by switching; a first parasitic diode connected between a current input terminal and the current output terminal of the first semiconductor switch; and a plurality of second parasitic diodes that are respectively connected between the current input terminals and current output terminals of the plurality of second semiconductor switches, wherein a cathode of the first parasitic diode is connected to cathodes of the plurality of second parasitic diodes, and wherein the controller switches on the first semiconductor switch if the controller switches on at least one of the plurality of second semiconductor switches, and switches off the first semiconductor switch if the controller switches off all al the plurality of second semiconductor switches.

According to the present disclosure, the current input terminals of the plurality of second semiconductor switches are connected to the current output terminal of the first semiconductor switch. For example, a positive electrode of the battery is connected to the current input terminal of the first semiconductor switch, and a load is connected to the current output terminal of each of the plurality of semiconductor switches.

If power is supplied to at least one of the plurality of loads, the first semiconductor switch, and one second semiconductor switch to which power is supplied, or one or more of the plurality of second semiconductor switches that correspond to the plurality of loads are switched on. Accordingly, power is supplied from the battery to the one or more loads.

If all of the second semiconductor switches are switched off, the first semiconductor switch is switched off. Also, the cathode of the first parasitic diode is connected to the cathodes of the plurality of second parasitic diode. Thus, even if the negative electrode of the battery is incorrectly connected to the current input terminal of the first semiconductor switch in a state in which the first semiconductor switch and all of the second semiconductor switches are off, no current flows to the plurality of loads.

As described above, the supply of power is controlled by ((the number of loads)+1) semiconductor switches as appropriate.

In the power supply control device according to the present disclosure, the first semiconductor switch is switched on if a voltage at a control terminal with respect to a potential of the current input terminal is at least a first threshold, the plurality of second semiconductor switches are each switched on if a voltage at a control terminal with respect to a potential of the current output terminal is at least a second threshold, the power supply control device includes a plurality of diodes whose cathodes are connected to the control terminal of the first semiconductor switch, the number of diodes is the same as the number of second semiconductor switches, and anodes of the plurality of diodes are respectively connected to control terminals of the plurality of second semiconductor switches.

According to the present disclosure, the anodes of the diodes are respectively connected to the control terminals of the plurality of second semiconductor switches, and the control terminal of the first semiconductor switch is connected to the cathodes of the plurality of diodes. Thus, if the voltage at the control terminal of one of the second semiconductor switches is increased, the voltage at the control terminal of the first semiconductor switch also increases, and the first semiconductor switch and the second semiconductor switch are switched on together. Thus, if at least one of the plurality of second semiconductor switches is switched on, the first semiconductor switch is also switched on. Moreover, if the voltage at the control terminal of one of the second semiconductor switches that is on is reduced in a state in which the plurality of second semiconductor switches are on, the voltage at the control terminal of the first semiconductor switch does not decrease, and thus the first semiconductor switch is not switched off.

The power supply control device according to the present disclosure includes a resistor connected between the current input terminal and the control terminal of the first semiconductor switch.

According to the present disclosure, because the resistor is connected between the current input terminal and the control terminal of the first semiconductor switch, if all of the second semiconductor switches are off, then, no current flows through the resistor, and a difference between voltages at the current input terminal and the control terminal of the first semiconductor switch is zero V.

The voltages at the control terminals of the first semiconductor switch and the second semiconductor switches increase by supply current from the control terminals to parasitic capacitances connected between the current input terminal and the control terminals and parasitic capacitances connected between the current output terminals and the control terminals, and the first semiconductor switch and the second semiconductor switches are switched on.

For example, the positive electrode of the battery is connected to the current input terminal of the first semiconductor switch, and a load is connected to the current output terminal of each of the plurality of second semiconductor switches. If the voltage at the control terminal of one of the second semiconductor switches is increased in a state in which the first semiconductor switch is off, the overall power supplied to the control terminal of the second semiconductor switch is supplied to two parasitic capacitances connected to this control terminal, until the voltage at the control terminal reaches at least the voltage output from the battery, and the voltage at this control terminal increases. If the voltage at the control terminal of the second semiconductor switch reaches at least the voltage output from the battery, power is supplied to two parasitic capacitances connected to the control terminal of the first semiconductor switch and two parasitic capacitances connected to the control terminals of the second semiconductor switches. Accordingly, voltages at the control terminals of the first semiconductor switch and the second semiconductor switches increase.

The power supply control device according to the present disclosure includes a switch that is connected between the current input terminal and the control terminal of the first semiconductor switch and that is switched on if a negative voltage is applied to the current input terminal of the first semiconductor switch with respect to the potential of the current output terminals of the plurality of second semiconductor switches, in which the first semiconductor switch is off if a voltage across the current input terminal and the control terminal is approximately zero V.

According to the present disclosure, if a negative voltage is applied to the current input terminal of the first semiconductor switch with respect to the potential of the current output terminals of the plurality of second semiconductor switches, then the switches are switched on, the voltage across the current input terminal and the control terminal of the first semiconductor switch is approximately zero V, and the first semiconductor switch is switched off. Thus, even though the first semiconductor switch and at least one of the plurality of second semiconductor switches are on, if a negative voltage is applied to the current input terminal of the first semiconductor switch with respect to the potential of the current output terminals of the plurality of second semiconductor switches, the first semiconductor switch is forcibly switched off. Thus, current is reliably prevented from flowing from the plurality of second semiconductor switches to the first semiconductor switch.

According to the present disclosure, the supply of power can be controlled using a small number of semiconductor switches.

DETAILED DESCRIPTION OF EMBODIMENTS

Hereinafter, the present disclosure will be described in detail with reference to the drawings showing an embodiment.

Figure 1:
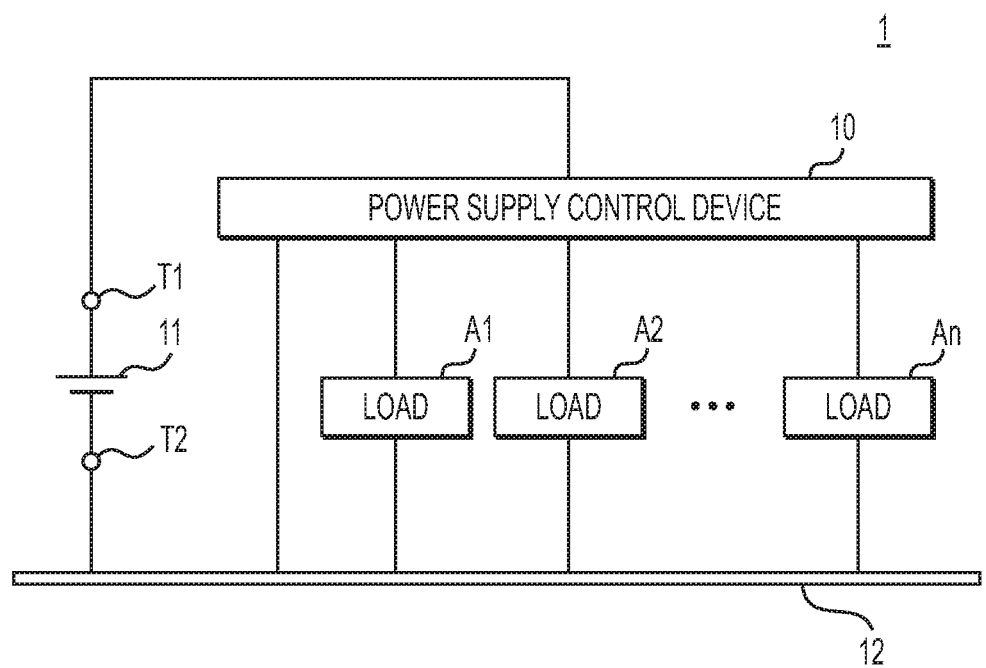
FIG. 1 is a block diagram showing the configuration of the main portions of a power supply system in this embodiment.

FIG. 1 is a block diagram showing the configuration of the main portions of a power supply system 1 in the present embodiment. The power supply system 1 is suitably installed in a vehicle, and includes a power supply control device 10, a battery 11, a conductor 12, and n loads A1, A1, . . . , and An (where n represents an integer of at least 2). The conductor 12 is a body of the vehicle, for example.

The power supply control device 10 is connected separately to the conductor 12, one end of each of the n loads A1, A2, . . . , and An, and a positive electrode terminal T1. The negative electrode terminal T2 and the other end of each of the n loads A1, A2, . . . , and An are connected to the conductor 12. The battery 11 is detachably connected between the positive electrode terminal T1 and the negative electrode terminal T2. A normal connection state of the battery 11 is a state in which the positive electrode and the negative electrode of the battery 11 are respectively connected to the positive electrode terminal T1 and the negative electrode terminal T2. An incorrect connection state of the battery 11 is a state in which the positive electrode and the negative electrode of the battery 11 are respectively connected to the negative electrode terminal T2 and the positive electrode terminal T1.

If the battery 11 is connected normally, then, power is separately supplied from the battery 11 via the power supply control device 10 to the n loads A1, A2, . . . , and An. The power supply control device 10 controls the supply of power from the battery 11 to the n loads A1, A2, . . . , and An. The n loads A1, A2, . . . , and An are electric devices installed in the vehicle, and when power is supplied to these loads, these loads operate, and when power supply is stopped, these load stop operating.

If the battery 11 is connected incorrectly, the power supply control device 10 prevents current from flowing from the negative electrode terminal T2 to the n loads A1, A2, . . . , and An.

Figure 2:
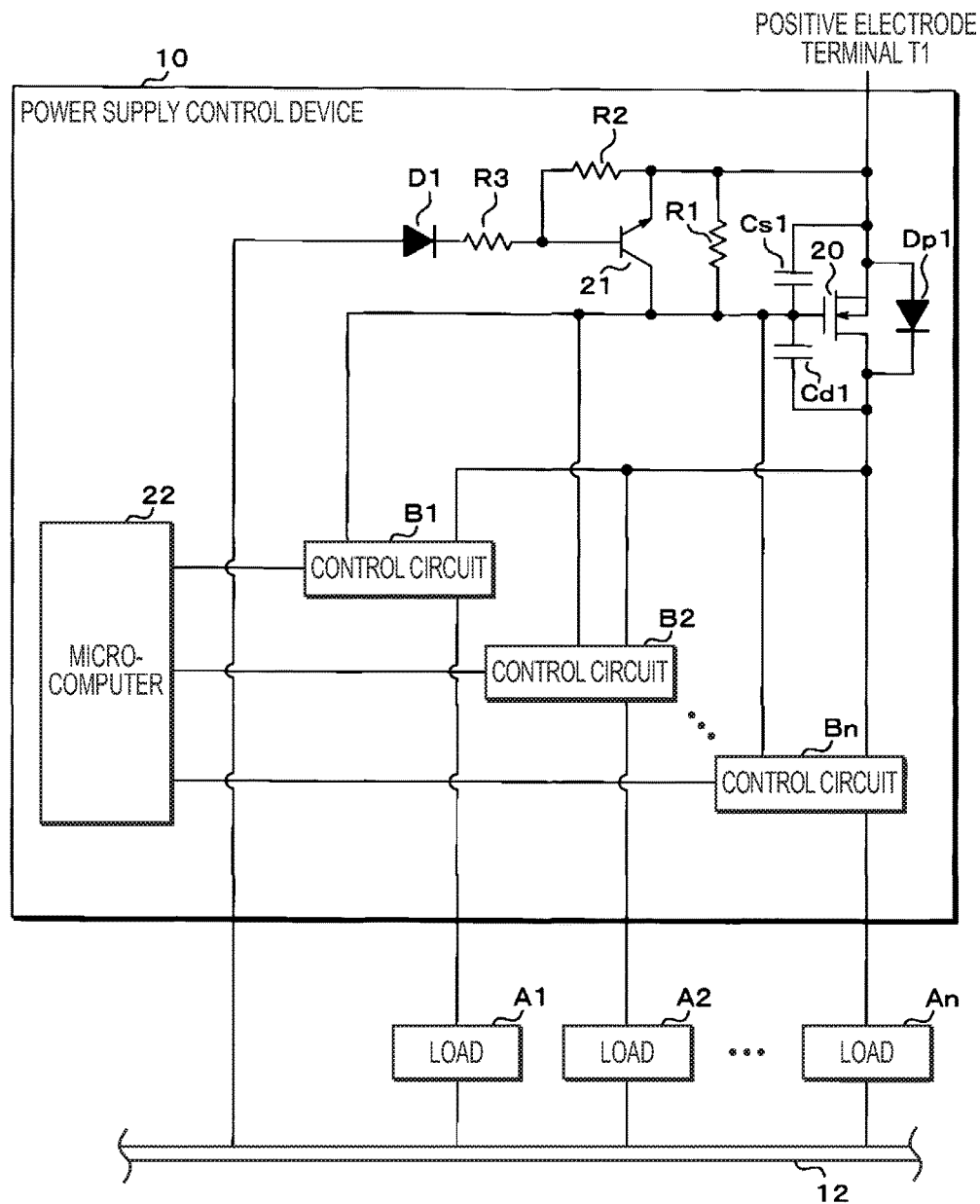
FIG. 2 is a circuit diagram of a power supply control device.

FIG. 2 is a circuit diagram of the power supply control device 10. The power supply control device 10 includes a first semiconductor switch 20, a switch 21, a microcomputer 22, n control circuits B1, B2, . . . , and Bn, a diode D1, resistors R1, R2, and R3.

The first semiconductor switch 20 is an N-channel FET. Thus, the power supply control device 10 further includes a parasitic diode Dp1 and parasitic capacitances Cs1 and Cd1 that are formed when the first semiconductor switch 20 is manufactured. The parasitic diode Dp1 is connected between the source and the drain of the first semiconductor switch 20, and the anode and the cathode of the parasitic diode Dp1 are respectively connected to the source and the drain of the first semiconductor switch 20. The parasitic capacitance Cs1 is connected between the gate and the source of the first semiconductor switch 20, and the parasitic capacitance Cd1 is connected between the gate and the drain of the first semiconductor switch 20. The parasitic diode Dp1 functions as a first parasitic diode. The switch 21 is an NPN bipolar transistor.

The source of the first semiconductor switch 20 is connected to the positive electrode terminal T1. The gate and the drain of the first semiconductor switch 20 are connected to the n control circuits B1, B2, . . . , and Bn. The n control circuits B1, B2, . . . , and Bn are further connected to one end of each of the n loads A1, A2, . . . , and An. The other end of each of the n loads A1, A2, . . . , and An is connected to the conductor 12. The n control circuits B1, B2, . . . , and Bn are further individually connected to the microcomputer 22.

An emitter of the switch 21 and one end of each of the resistors R1 and R2 are further individually connected to the source of the first semiconductor switch 20. The other end of the resistor R1 and a collector of the switch 21 are connected to the gate of the first semiconductor switch 20. The other end of the resistor R2 is connected to a base of the switch 21 and one end of the resistor R3. The other end of the resistor R3 is connected to the cathode of the diode D1. The anode of the diode D1 is connected to the conductor 12.

In this manner, the switch 21 and the resistor R1 are connected between the source and the gate of the first semiconductor switch 20.

Figure 3:
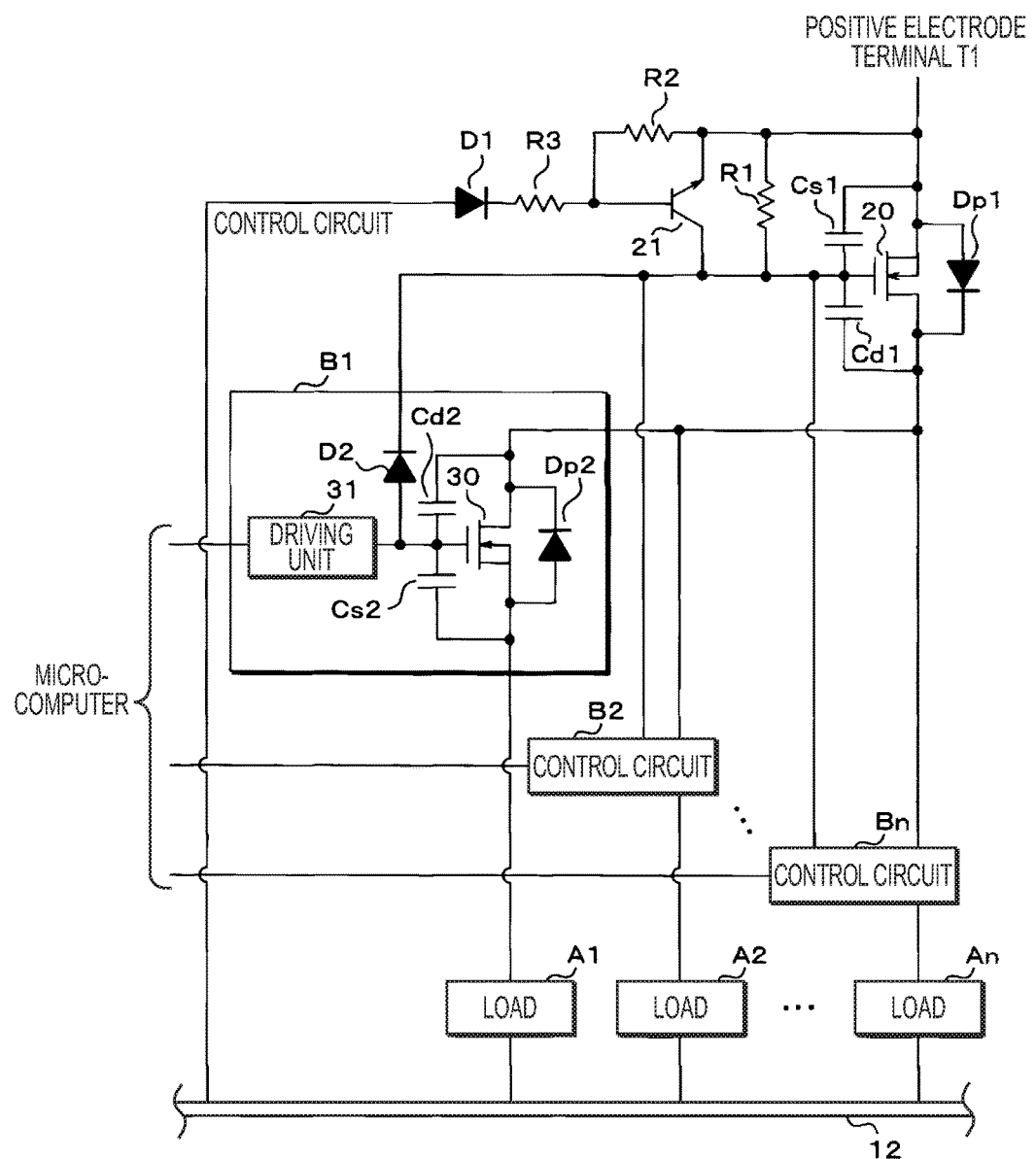
FIG. 3 is a circuit diagram of a control circuit.

FIG. 3 is a circuit diagram of the control circuit B1. The control circuit B1 includes a second semiconductor switch 30, a driving unit 31, and the diode D2.

The second semiconductor switch 30 is an N-channel FET. Thus, the control circuit B1 further includes a parasitic diode Dp2 and parasitic capacitances Cs2 and Cd2 that are formed when the second semiconductor switch 30 is manufactured. The parasitic diode Dp2 is connected between the drain and the source of the second semiconductor switch 30, and the anode and the cathode of the parasitic diode Dp2 are respectively connected to the source and the drain of the second semiconductor switch 30. The parasitic capacitance Cs2 is connected between the gate and the source of the second semiconductor switch 30, and the parasitic capacitance Cd2 is connected between the gate and the drain of the second semiconductor switch 30. The parasitic diode Dp2 functions as a second parasitic diode.

The drain of the second semiconductor switch 30 is connected to the drain of the first semiconductor switch 20. The source of the second semiconductor switch 30 is connected to one end of the load A1. The gate of the second semiconductor switch 30 is connected to the driving unit 31 and the anode of the diode D2. The cathode of the diode D2 is connected to the gate of the first semiconductor switch 20. The driving unit 31 is further connected to the microcomputer 22.

Similarly to the control circuit B1, also the control circuits B2, B3, . . . , and Bn each include a second semiconductor switch 30, a driving unit 31, a diode D2, a parasitic diode Dp2, and parasitic capacitances Cs2 and Cd2. Thus, the number of driving units 31, the number of diodes D2, the number of parasitic diodes Dp2, the number of parasitic capacitances Cs2, and the number of parasitic capacitances Cd2 are the same as the number of second semiconductor switches 30.

The second semiconductor switch 30, the driving unit 31, the diode D2, the parasitic diode Dp2, and the parasitic capacitances Cs2 and Cd2 of each of the control circuits B2, B3, . . . , and Bn are connected similarly to the second semiconductor switch 30, the driving unit 31, the diode D2, the parasitic diode Dp2, and the parasitic capacitances Cs2 and Cd2 of the control circuit B1, except for the connection of the source of the second semiconductor switch 30. The source of the second semiconductor switch 30 of each of the control circuits B2, B3, . . . , and Bn is connected to one end of the loads A2, A3, . . . , and An.

Thus, the cathode of the parasitic diode Dp1 of the first semiconductor switch 20 is connected to the cathode of the parasitic diode Dp2 of each of the n second semiconductor switches 30.

If the voltage at the gate of the first semiconductor switch 20 with respect to the potential of the source is at least an ON-threshold Vn1, then the resistance between the source and the drain is approximately zero Ω. At this time, the first semiconductor switch 20 is switched on. Also, if the voltage at the gate of the first semiconductor switch 20 with respect to the potential of the source is less than an OFF-threshold Vf1, then the resistance between the source and the drain is sufficiently large so that hardly any current flows between the source and the drain. In this manner, if the voltage at the gate of the first semiconductor switch 20 with respect to the potential of the source is less than the OFF-threshold Vf1, then the first semiconductor switch 20 is switched off. The OFF-threshold Vf1 is positive, and is less than the ON-threshold Vn1.

Similarly, if the voltage at the gate of the second semiconductor switch 30 with respect to the potential of the source is at least an ON-threshold Vn2, then the resistance between the source and the drain is approximately zero Ω. At this time, the second semiconductor switch 30 is switched on. Also, if the voltage at the gate of the second semiconductor switch 30, with respect to the potential of the source is less than an OFF-threshold Vf2, then the resistance between the source and the drain is sufficiently large so that hardly any current flows between the source and the drain. In this manner, if the voltage at the gate of the second semiconductor switch 30 with respect to the potential of the source is less than the OFF-threshold Vf2, then the second semiconductor switch 30 is switched off. The OFF-threshold Vf2 is positive, and is less than the ON-threshold Vn2.

Furthermore, if the voltage at the base of the switch 21 with respect to a potential of the emitter is at least an ON-threshold Vn3, then the resistance between the emitter and a collector is approximately zero Ω. At this time, the switch 21 is switched on. Also, if the voltage at the base of the switch 21 with respect to the potential of the emitter is less than an OFF-threshold Vf3, then the resistance between the emitter and the collector is sufficiently large, so that hardly any current flows between the emitter and the collector. In this manner, if the voltage at the gate of the switch 21 with respect to the potential of the emitter is less than the OFF threshold Vf3, then the switch 21 is switched off. The OFF-threshold Vf3 is positive, and is less than the ON-threshold Vn3.

If the battery 11 is connected normally, no current flows through the resistors R2 and R3 due to the effect of the diode D1. Thus, the voltage at the base of the switch 21 with respect to the potential of the emitter is approximately zero V and is less than the OFF-threshold Vf3. Thus, if the battery 11 is connected normally, the switch 21 is off.

If the battery 11 is connected incorrectly, in other words, if a negative voltage is applied to the source of the first semiconductor switch 20 with respect to the potential of the sources of the n second semiconductor switches 30 included in the control circuits B1, B2, . . . , and Bn, then a current flows from the negative electrode terminal T2 through the conductor 12, the diode D1, the resistors R3 and R2 to the positive electrode terminal T1 in this order. At this time, the voltage decreases at the resistor R2, and the voltage at the base of the switch 21 with respect to the potential of the emitter is at least the ON-threshold Vn3, and the switch 21 is switched on. If the switch 21 is on, the voltage at the gate of the first semiconductor switch 20 with respect to the potential of the source is approximately zero V, and the voltage is less than the OFF-threshold Vf1. At this time, the first semiconductor switch 20 is off.

Thus, if the battery 11 is connected incorrectly, the switch 21 is switched on, and the first semiconductor switch 20 is switched off. As described above, because the cathode of the parasitic diode Dp1 is connected to the drain of the first semiconductor switch 20, if the first semiconductor switch 20 is off, then no current flows from the drain to the source of the first semiconductor switch 20. Thus, if the battery 11 is connected incorrectly, no current flows to the n loads A1, A2, . . . , and An.

If the battery 11 is connected incorrectly in a state in which the first semiconductor switch 20 is off, no current flows from the negative electrode terminal T2 to the 11 loads A1, A2, . . . , and An irrespective of whether or not the switch 21 is on.

Also, even if the first semiconductor switch 20 and at least one of the n second semiconductor switches 30 are on, when the battery 11 is connected incorrectly, the first semiconductor switch 20 is forcibly switched off, and thus current is reliably prevented from flowing to the n loads A1, A2, . . . , and An.

Hereinafter, a power supply control device 10 will be described for a state in which the battery 11 is connected normally. For simplifying the description, the width of the voltage drop of each of the parasitic diodes Dp1 and Dp2 and the diode D2 in the forward direction is regarded as being sufficiently small.

In the first semiconductor switch 20, current is supplied from the gate to the parasitic capacitances Cs1 and Cd1, and the voltage at the gate with respect to the potential of the source is increased to at least the ON-threshold Vn1. This switches on the first semiconductor switch 20.

Also, the voltage at the gate with respect to the potential of the source is reduced to less than the OFF-threshold Vf1 by discharging the parasitic capacitances Cs1 and Cd1. This switches off the first semiconductor switch 20.

In the second semiconductor switch 30, current is supplied from the gate to the parasitic capacitances Cs2 and Cd2, and the voltage at the gate with respect to the potential of the source is increased to be at least the ON-threshold Vn2. This switches on the second semiconductor switch 30.

Also, the voltage at the gate with respect to the potential of the source is reduced to less than the OFF-threshold Vf2 by discharging the parasitic capacitances Cs2 and Cd2. This switches off the second semiconductor switch 30.

A driving signal for instructing driving of a load Ak and a stop signal for instructing stopping of driving the load Ak are input from the microcomputer 22 to the driving unit 31 of the control circuit Bk (k=1, 2, . . . , and n).

If the driving signal is input, the driving unit 31 of the control circuit Bk outputs a driving current that is higher than a voltage Vb that is output from the battery 11 via the internal resistance (not shown) to the gate of the second semiconductor switch 30 of the control circuit Bk and the gate of the first semiconductor switch 20. The driving unit 31 of the control circuit Bk outputs the driving voltage via the internal resistance and the diode D2 to the gate of the first semiconductor switch 20.

The driving unit 31 of the control circuit Bk outputs the driving voltage, and thereby current is supplied from the gate of the second semiconductor switch 30 of the control circuit Bk to the parasitic capacitances Cs2 and Cd2, and current is supplied from the gate of the first semiconductor switch 20 to the parasitic capacitances Cs1 and Cd1. This charges the parasitic capacitances Cs1, Cd1, Cs2, and Cd2, and the voltages at the gates of the first semiconductor switch 20 and the second semiconductor switch 30 with respect to the potential of their sources increase.

The driving unit 31 of the control circuit Bk outputs the driving voltage, and thereby, the voltage at the gate of the first semiconductor switch 20 with respect to the potential of the source is at least the ON-threshold Vn1, and the voltage at the gate of the second semiconductor switch 30 of the control circuit Bk with respect to the potential of the source is at least the ON-threshold Vn2. This switches on the first semiconductor switch 20 and the second semiconductor switch 30 of the control circuit Bk.

Thus, if at least one of the driving units 31 of the n control circuits B1, B2, . . . , and Bn outputs the driving voltage, then the first semiconductor switch 20 is switched on. Power is supplied from the battery 11 to one or more of the n loads A1, A2, . . . , and An, which are connected to the respective sources of the second semiconductor switch 30 that are on, and the one or more loads operate.

As described above, if at least one of the n second semiconductor switches 30 is switched on, then the driving units 31 of the n control circuits B1, B2, . . . , and Bn switch on the first semiconductor switch 20.

If the second semiconductor switch 30 of the control circuit Bk (k=1, 2, . . . , and n) is on, current flows from the positive electrode terminal T1 to the source and the drain of the first semiconductor switch 20, and the drain and the source of the second semiconductor switch 30 of the control circuit Bk in this order.

Thus, the source of the first semiconductor switch 20 and the drain of the second semiconductor switch 30 of the control circuit Bk function as current input terminals, and the drain of the first semiconductor switch 20 and the source of the second semiconductor switch 30 of the control circuit Bk function as current output terminals. The gates of the first semiconductor switch 20 and the second semiconductor switches 30 function as control terminals.

If the driving unit 31 of the control circuit Bk receives a stop signal, then the driving unit 31 connects the gate of the second semiconductor switch 30 to the conductor 12 via its internal resistance. Accordingly, current flows from the parasitic capacitances Cs2 and Cd2 to the driving unit 31, the parasitic capacitances Cs2 and Cd2 discharge, the voltage at the gate of the second semiconductor switch 30 is less than the OFF-threshold Vf2, and the second semiconductor switch 30 is switched off. If the second semiconductor switch 30 is switched off, then the supply of power to the load Ak stops, and the load Ak stops operating.

When discharging ends in a state in which the gate of the second semiconductor switch 30 of the control circuit Bk is connected to the conductor 12, the voltage at the drain of the second semiconductor switch 30 approximately coincides with the voltage Vb that is output from the battery 11, and the voltages at the gate and the source of the second semiconductor switch 30 are approximately zero V.

The microcomputer 22 controls the operations of the n control circuits B1, B2, . . . , and Bn by outputting the driving signal or the stop signal to the driving units 31 of the n control circuits B1, B2, . . . , and Bn.

If the microcomputer 22 outputs the stop signal to all of the n driving units 31, and all of the n driving units 31 connect the gates of the n second semiconductor switches 30 to the conductor 12, the output of the voltages to the gate of the first semiconductor switch 20 stops. Thus, current flows from one end of the parasitic capacitances Cs1 and Cd1 on the gate side of the first semiconductor switch 20 through the resistor R1, and the parasitic capacitances Cs1 and Cd1 of the first semiconductor switch 20 discharge. Accordingly, the voltage at the gate of the first semiconductor switch 20 with respect to the potential of the source is less than the OFF-threshold Vf1, and the first semiconductor switch 20 is switched off.

When the parasitic capacitances Cs1 and Cd1 stop discharging in a state in which the gates of the n second semiconductor switches 30 are connected to the conductor 12, the voltages between both ends of the parasitic capacitances Cs1 and Cd1 are approximately zero V, and the power accumulated in the parasitic capacitances Cs1 and Cd1 is approximately zero W.

As described above, if all of the driving units 31 of the n control circuits B1, B2, . . . , and Bn connect the gates of the second semiconductor switches 30 to the conductor 12 via its internal resistance, then the first semiconductor switch 20 is switched off. If the driving units 31 of the n control circuits B1, B2, . . . , and Bn switch off all of the is second semiconductor switches 30, the driving units 31 switch off the first semiconductor switch 20.

The driving units 31 of the n control circuits B1, B2, . . . , and Bn function as switching units.

In the power supply control device 10, no current flows to the n driving units 31 from the parasitic capacitances Cs1 and Cd1 of the first semiconductor switch 20 to the n driving units 31 due to the effect of the n diodes D2. Thus, even if one of the plurality of driving units 31 that output the driving voltage connects the gate of the second semiconductor switch 30 to the conductor 12 via its internal resistance, the first semiconductor switch 20 is still kept on.

In other words, if the voltage at the gate of one second semiconductor switch 30 that is on is reduced in a state in which the plurality of second semiconductor switches 30 are on, the voltage at the gate of the first semiconductor switch 20 does not decrease, and thus the first semiconductor switch 20 is not switched off.

Figure 4:
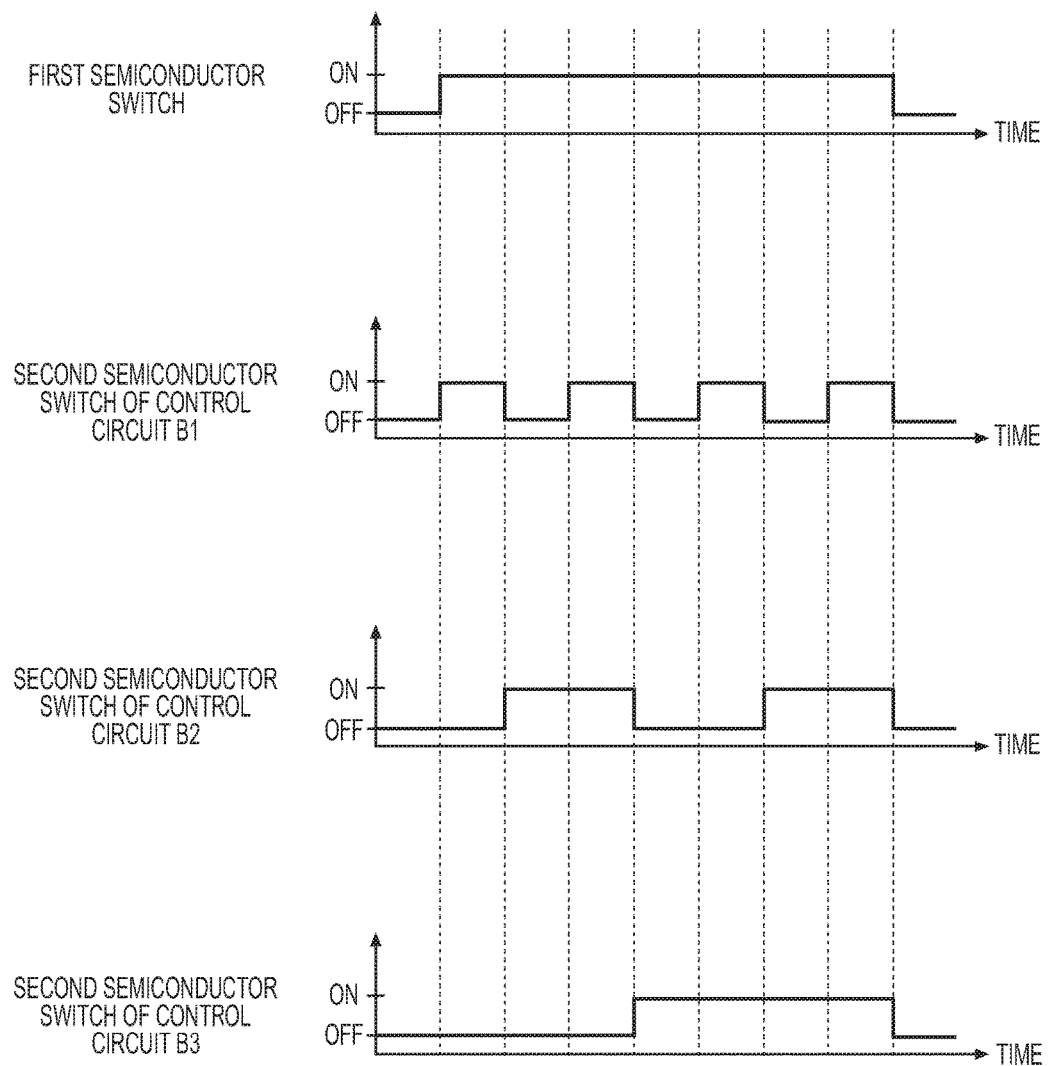
FIG. 4 is a timing chart for illustrating operations of the power supply control device.

FIG. 4 is a timing chart for illustrating operations of the power supply control device 10. Herein, the operations of the power supply control device 10 when n is three will be described. FIG. 4 shows the change of the on and off states of the first semiconductor switch 20, and the change of the on and off states of the second semiconductor switches 30 of the control circuits B1, B2, and B3.

As shown in FIG. 4, if all of the three second semiconductor switches 30 are switched off, then the first semiconductor switch 20 is switched off. Also, if at least one of the three second semiconductor switches 30 is on, the first semiconductor switch 20 is on.

Power is supplied to at least one of the three loads A1, A2, and A3 that is connected to the source of the second semiconductor switch 30 that is on, and this load operates. Also, no power is supplied to at least one of the three loads A1, A2, and A3 that is connected to the source of the second semiconductor switch 30 that is off, and this load stops operating.

For example, if the second semiconductor switches 30 of the control circuits B1 and B2 are on and the second semiconductor switch 30 of the control circuit B3 is off, then the loads A1 and A2 operate and the load A3 stops operating.

In the power supply control device 10, the driving unit 31 of the control circuit Bk (k=1, 2, . . . , and n) switches the first semiconductor switch 20 and the second semiconductor switch 30 of the control circuit Bk from off to on at a high speed in a state in which the first semiconductor switch 20 and the n second semiconductor switches 30 are off.

A comparative power supply control device is a power supply control device in which the resistor R1 is not provided, and the gate of the first semiconductor switch 20 is connected to the gate of the second semiconductor switch 30 of the control circuit Bk without passing through the diode D2. The driving unit 31 of the control circuit Bk outputs the driving voltage, and thereby the comparative power supply control device is capable of switching the first semiconductor switch 20 and the second semiconductor switch 30 of the control circuit Bk from off to on.

As a matter of course, the driving units 31 of the control circuits Bk in the power supply control device 10 and the comparative power supply control device supply the same power.

Figure 5:
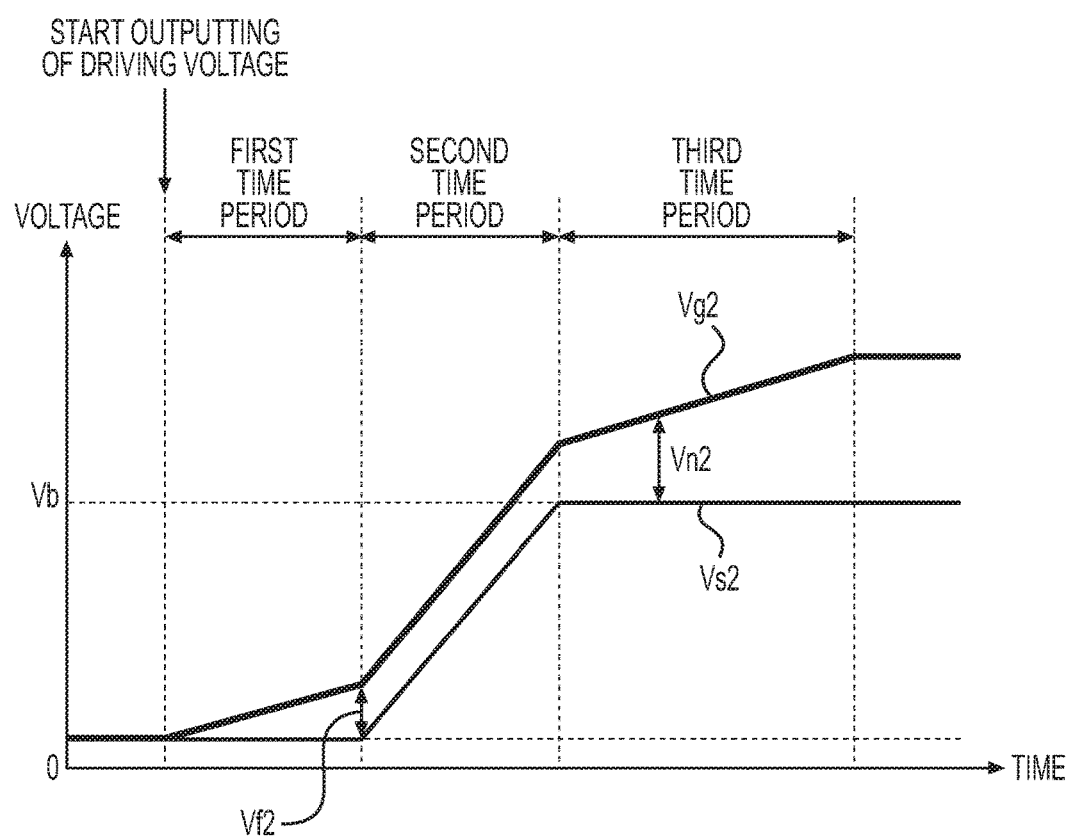
FIG. 5 is a diagram illustrating switching on a second semiconductor switch of the control circuit.

FIG. 5 is a diagram illustrating switching on the second semiconductor switch 30 of the control circuit Bk. FIG. 5 shows a change of a voltage Vs2 at the source and a change of a voltage Vg2 at the gate in the second semiconductor switch 30 of the control circuit Bk. Hereinafter, the voltage Vs2 at the source and the voltage Vg2 at the gate are respectively referred to as the source voltage Vs2 and the gate voltage Vg2. The source voltage Vs2 and the gate voltage Vg2 are each a voltage with respect to the potential of the conductor 12. The change of the gate voltage Vg2 and the change of the source voltage Vs2 are respectively indicated by thick and thin lines. A portion in which the change of the gate voltage Vg2 and the change of the source voltage Vs2 overlap each other is indicated by a thick line.

With regard to the power supply control device 10 and the comparative power supply control device, the direction of the change of the source voltage Vs2 and the direction of the change of the gate voltage Vg2 are not different from each other.

Hereinafter, a time period from when the driving unit 31 of the control circuit Bk starts outputting the driving voltage to when the gate voltage Vg2 reaches the OFF threshold Vf2 is called a first time period, and a time period from when the gate voltage reaches the OFF-threshold Vf2 to when the source voltage Vs2 reaches the voltage Vb output from the battery 11 is called a second time period. Furthermore, a time period from when the source voltage Vs2 reaches the voltage Vb output from the battery 11 to when the gate voltage Vg2 reaches the driving voltage is called a third time period. The first time period and the second time period in the power supply control device 10 are respectively shorter than the first time period and the second time period in the comparative power supply control device. The length of the third time period in the power supply control device 10 is approximately equal to the length of the third time period in the comparative power supply control device.

First, switching on in the comparative power supply control device will be described. In the comparative power supply control device, if the first semiconductor switch 20 and the second semiconductor switches 30 of the n control circuits B1, B2, . . . , and Bn are off, current flows from the positive electrode terminal T1 through the parasitic capacitance Cs1 to the driving unit 31 in this order, and current flows from the positive electrode terminal T1 through the parasitic diode Dp1 and the parasitic capacitance Cd1 to the driving unit 31 in this order. Thus, with the first semiconductor switch 20, the voltages at the source and the drain with respect to the potential of the gate approximately coincide with the voltage Vb output from the battery 11. Therefore, the voltages at the gate of the first semiconductor switch 20 with respect to the potential of the source and the drain are negative.

In the first time period, the parasitic capacitances Cs1 and Cs2 are charged. Current is supplied from the gate of the first semiconductor switch 20 to the parasitic capacitance Cs1, and current is supplied from the gate of the second semiconductor switch 30 to the parasitic capacitance Cs2. The gate voltage Vg2 increases by charging the parasitic capacitance Cs2. The source voltage Vs2 is maintained at zero V until a difference between the gate voltage Vg2 and the source voltage Vs2 reaches the OFF-threshold Vf2.

If the difference between the gate voltage Vg2 and the source voltage Vs2 is the OFF-threshold Vf2, current flows between the drain and the source of the second semiconductor switch 30. At this time, because the first semiconductor switch 20 is off, current flows from the positive electrode terminal T1 through the parasitic diode Dp1 of the first semiconductor switch 20.

If current flows to the load Ak, voltage is generated between both ends of the load Ak, and the source voltage Vs2 increases. The voltage across both ends of the load Ak also increases together with an increase in the current flowing to the load Ak. In the second time period, the parasitic capacitances Cs1, Cd1, and Cd2 are charged. The gate voltage Vg2 increases by charging the parasitic capacitance Cs2. Current is supplied from the gate of the first semiconductor switch 20 to the parasitic capacitances Cs1 and Cd1. Current is supplied from the gate of the second semiconductor switch 30 to the parasitic capacitance Cd2.

If the gate voltage Vg2 increases, current flowing to the load Ak increases, and the source voltage Vs2 increases. The source voltage Vs2 increases together with an increase in the gate voltage Vg2 until reaching the voltage Vb output from the battery 11 while the difference between the source voltage Vs2 and the gate voltage Vg2 is maintained at the OFF-threshold Vf2. After reaching the voltage Vb output from the battery 11, the source voltage Vs2 is maintained at the voltage Vb output from the battery 11.

In the third time period, the parasitic capacitances Cs1, Cd1, Cs2, and Cd2 are charged. By charging the parasitic capacitances Cs2 and Cd2, the gate voltage Vg2 increases up to the driving voltage in a state in which the source voltage Vs2 is maintained at the voltage Vb output from the battery 11. When the difference between the gate voltage Vg2 and the source voltage Vs2 is at least the ON-threshold Vn2, the second semiconductor switch 30 of the control circuit Bk is switched on.

The voltage at the gate of the first semiconductor switch 20 with respect to the potential of the conductor 12 changes in the same manner as the gate voltage Vg2, and the voltage at the source of the first semiconductor switch 20 with respect to the potential of the conductor 12 approximately coincides with the voltage Vb output from the battery 11. The voltage at the gate of the first semiconductor switch 20 with respect to the potential of the source increases from a negative voltage. If the voltage at the gate with respect to the potential of the source is at least the ON-threshold Vn1, then the first semiconductor switch 20 is switched on.

Next, switching on in the power supply control device 10 will be described. In the power supply control device 10, if the first semiconductor switch 20 and the second semiconductor switches 30 of the n control circuits B1, B2, . . . , and Bn are off, the parasitic capacitance Cs1 discharges via the resistor and the parasitic capacitance Cd1 discharges via the resistor R1 and the diode Dp1. Thus, the voltage at the gate of the first semiconductor switch 20 with respect to the potential at the source and the voltage at the gate with respect to the potential at the drain are approximately zero V.

In the first time period, no voltage is output from the driving unit 31 to the gate of the first semiconductor switch 20 from when the driving unit 31 of the control circuit Bk, starts outputting the driving voltage to when the gate voltage Vg2 of the second semiconductor switch 30 is at least the voltage Vb output from the battery 11.

In the first time period, the overall power supplied by the driving unit 31 of the control circuit Bk is supplied to the parasitic capacitance Cs2, and only the parasitic capacitance Cs2 is charged. Current is supplied from the gate of the second semiconductor switch 30 to the parasitic capacitance Cs2. The gate voltage Vg2 increases by charging the parasitic capacitance Cs2. The source voltage Vs2 is maintained at zero V until a difference between the gate voltage Vg2 and the source voltage Vs2 reaches the OFF-threshold Vf2. The OFF-threshold Vf2 is less than the voltage Vb output from the battery 11.

If the difference between the gate voltage Vg2 and the source voltage Vs2 is the OFF-threshold Vf2, current flows between the drain and the source of the second semiconductor switch 30. At this time, because the first semiconductor switch 20 is off, current flows from the positive electrode terminal T1 through the parasitic diode Dp1 of the first semiconductor switch 20.

Note that in the first time period, the voltage at the drain of the first semiconductor switch 20 increases due to an increase in the gate voltage Vg2, and the voltage at the gate of the first semiconductor switch 20 is maintained at the voltage Vb output from the battery 11. Thus, the parasitic capacitance Cd1 is charged. However, the electrostatic capacitance of the parasitic capacitance Cd1 is one tenth of the electrostatic capacitance of the parasitic capacitance Cs1, for example, and thus is sufficiently small so that power supplied to the parasitic capacitance Cd1 in the first time period is negligibly small.

If current flows to the load Ak, a voltage is generated between both ends of the load Ak, and the source voltage Vs2 increases. The voltage across both ends of the load Ak also increases together with an increase in the current flowing to the load Ak. In the second time period, the parasitic capacitance Cd2 is charged, and the gate voltage Vg2 increases. Current is supplied from the gate of the second semiconductor switch 30 to the parasitic capacitance Cd2.

With the power supply control device 10, similarly to the comparative power supply control device, the source voltage Vs2 increases together with an increase in the gate voltage Vg2 until reaching the voltage Vb output from the battery 11 while the difference between the source voltage Vs2 and the gate voltage Vg2 is maintained at the OFF-threshold Vf2. After reaching the voltage Vb output from the battery 11, the source voltage Vs2 is maintained at the voltage Vb output from the battery 11.

In the third time period, similarly to the comparative power supply control device, the parasitic capacitances Cs1, Cd1, Cs2, and Cd2 are charged. By charging the parasitic capacitances Cs2 and Cd2, the gate voltage Vg2 increases up to the driving voltage in a state in which the source voltage Vs2 is maintained at the voltage Vb output from the battery 11. When the difference between the gate voltage Vg2 and the source voltage Vs2 is at least the ON-threshold Vn2, the second semiconductor switch 30 of the control circuit Bk is switched on.

The voltage at the gate of the first semiconductor switch 20 with respect to the potential of the conductor 12 is maintained at the voltage Vb output from the battery 11 while the gate voltage Vg2 is less than the voltage Vb output from the battery 11, and after the gate voltage Vg2 is at least the voltage Vb output from the battery 11, the voltage at the gate of the first semiconductor switch 20 changes in the same manner as the gate voltage Vg2. The voltage at the source of the first semiconductor switch 20 with respect to the potential of the conductor 12 approximately coincides with the voltage Vb output from the battery 11. The voltage at the gate of the first semiconductor switch 20 with respect to the potential of the source increases from zero V. If the voltage at the gate with respect to the potential of the source is at least the ON-threshold Vn1, then the first semiconductor switch 20 is switched on.

As described above, with the comparative power supply control device, the driving unit 31 of the control circuit Bk outputs the driving voltage, and thereby, the parasitic capacitances Cs1 and Cs2 are charged in the first time period, the parasitic capacitances Cs1, Cd1, and Cd2 are charged in the second time period, and the parasitic capacitances Cs1, Cd1, Cs2, and Cs2 are charged in the third time period. When the driving unit 31 of the control circuit Bk outputs the driving voltage, the voltages at the gate of the first semiconductor switch 20 with respect to the source and the drain are negative. Thus, the parasitic capacitance Cs1 is charged in the first time period, and the parasitic capacitances Cs1 and Cd1 are charged in the second time period.

On the other hand, with the power supply control device 10, the driving unit 31 of the control circuit Bk outputs the driving voltage, and thereby, the parasitic capacitance Cs2 is charged in the first time period, the parasitic capacitance Cd2 is charged in the second time period, and the parasitic capacitances Cs1, Cd1, Cs2, and Cs2 are charged in the third time period. When the driving unit 31 of the control circuit Bk outputs the driving voltage, the voltage of the first semiconductor switch 20 with respect to the potentials of the source and the drain are zero V. Thus, it is not necessary to charge the parasitic capacitance Cs1 in the first time period, and it is not necessary to charge the parasitic capacitances Cs1 and Cd1 in the second time period.

Thus, with the power supply control device 10, it takes a short time from when the driving unit 31 of the control circuit Bk outputs the driving voltage to when the first semiconductor switch 20 and the second semiconductor switch 30 of the control circuit Bk are switched on. Thus, the power supply control device 10 has a small switching loss caused when the second semiconductor switch 30 of the control circuit Bk is switched on from off. Furthermore, it takes a short time for current to flow to the parasitic diode Dp1 of the first semiconductor switch 20, and power consumption is small.

Also, the power supply control device 10 has a fast speed at which the driving unit 31 of the control circuit Bk switches the first semiconductor switch 20 and the second semiconductor switch 30 of the control circuit Bk off from on in a state in which the first semiconductor switch 20 and the second semiconductor switch 30 of the control circuit Bk (k=1, 2, . . . , and n) are on and the other second semiconductor switches 30 are off.

With the comparative power supply control device, if the driving unit 31 of the control circuit Bk connects the gate of the second semiconductor switch 30 of the control circuit Bk to the conductor 12 via its internal resistance, current flows from the parasitic capacitances Cd1, Cd1, Cs2, and Cd2 to the driving unit 31, and the parasitic capacitances Cs1, Cd1, Cs2, and Cd2 discharge. As described above, if the voltage at the gate of the first semiconductor switch 20 with respect to the potential of the source is less than an OFF-threshold Vf1, the first semiconductor switch 20 is switched off. If the voltage at the gate of the second semiconductor switch 30 with respect to the potential of the source is less than the OFF-threshold Vf2, the second semiconductor switch 30 is switched off.

With the power supply control device 10, if the driving unit 31 of the control circuit Bk connects the gate of the second semiconductor switch 30 of the control circuit Bk to the conductor 12 via its internal resistance, current flows from the parasitic capacitances Cs2 and Cd2 to the driving unit 31, and the parasitic capacitances Cs2 and Cd2 discharge. The parasitic capacitances Cs1 and Cd1 discharge via the resistor R1. Thus, with the second semiconductor switch 30, it takes a short time from when the driving unit 31 of the control circuit Bk connects the second semiconductor switch 30 to the conductor 12 via its internal resistance to when the voltage at the gate with respect to the potential of the source is less than the OFF-threshold Vf2. Thus, the power supply control device 10 has a small switching loss caused when the second semiconductor switch 30 of the control circuit Bk is switched off from on.

With the power supply control device 10, if power is supplied to at least one of the plurality of loads A1, A2, . . . , and An, the first semiconductor switch 20, and one second semiconductor switch to which power is supplied, or one or more of the plurality of second semiconductor switches 30 that correspond to the plurality of loads are switched on. Accordingly, power is supplied from the battery 11 to the one or more loads. Also, because the cathode of the parasitic diode Dp1 is connected to the cathode of the n parasitic diodes Dp2, even if the battery 11 is connected incorrectly in a state in which the first semiconductor switch 20 and the n second semiconductor switches 30 are off, no current flows to the n loads A1, A2, . . . , and An.

As described above, the supply of power from the battery 11 to the n loads A1, A2, . . . , and An is controlled by one first semiconductor switch 20 and the n second semiconductor switches 30 as appropriate. The total number of first semiconductor switch 20 and second semiconductor switches 30 is small, and thus the power supply control device 10 has a small size and the cost for manufacturing the power supply control device 10 is low.

Also, as described above, even if the first semiconductor switch 20 and at least one of the n second semiconductor switches 30 are on, if the battery 11 is connected incorrectly, the switch 21 is switched on, and the first semiconductor switch 20 is forcibly switched off. Thus, current is reliably prevented from flowing from the negative electrode terminal T2 to the n loads A1, A2, . . . , and An.

Note that the switch 21 is not limited to an NPN bipolar transistor as long as the switch 21 is switched off if the battery 11 is connected incorrectly. Thus, the switch 21 may also be a PNP bipolar transistor or an FET, for example.

Embodiments that were disclosed are to be considered exemplary in all respects and in no way limiting.

The invention claimed is:

1. A power supply control device comprising
a controller configured to switch on and off a first semiconductor switch and a plurality of second semiconductor switches whose current input terminals are connected to a current output terminal of the first semiconductor switch, the controller being configured to control supply of power via the plurality of second semiconductor switches by switching;
a first parasitic diode connected between a current input terminal and the current output terminal of the first semiconductor switch; and
a plurality of second parasitic diodes that are respectively connected between the current input terminals and current output terminals of the plurality of second semiconductor switches,
wherein a cathode of the first parasitic diode is connected to cathodes of the plurality of second parasitic diodes, and
wherein the controller switches on the first semiconductor switch if the controller switches on at least one of the plurality of second semiconductor switches, and switches off the first semiconductor switch if the controller switches off all of the plurality of second semiconductor switches.

2. The power supply control device according to claim 1, wherein:
the first semiconductor switch is switched on if a voltage at a control terminal with respect to a potential of the current input terminal is at least a first threshold,
the plurality of second semiconductor switches are each switched on if a voltage at a control terminal with respect to a potential of the current output terminal is at least a second threshold,
the power supply control device includes a plurality of diodes whose cathodes are connected to the control terminal of the first semiconductor switch,
a number of diodes is the same as a number of second semiconductor switches, and
anodes of the plurality of diodes are respectively connected to control terminals of the plurality of second semiconductor switches.

3. The power supply control device according to claim 2, comprising:
a resistor connected between the current input terminal and the control terminal of the first semiconductor switch.

4. The power supply control device according to claim 2, comprising:
a switch that is connected between the current input terminal and the control terminal of the first semiconductor switch and that is switched on if a negative voltage is applied to the current input terminal of the first semiconductor switch with respect to the potential of the current output terminals of the plurality of second semiconductor switches,
wherein the first semiconductor switch is off if a voltage across the current input terminal and the control terminal is approximately zero V.

* * * * *